United States Patent [19]

Brown

[11] Patent Number: 5,672,889

[45] Date of Patent: Sep. 30, 1997

[54] VERTICAL CHANNEL SILICON CARBIDE METAL-OXIDE-SEMICONDUCTOR FIELD EFFECT TRANSISTOR WITH SELF-ALIGNED GATE FOR MICROWAVE AND POWER APPLICATIONS, AND METHOD OF MAKING

[75] Inventor: Dale Marius Brown, Schenectady, N.Y.

[73] Assignee: General Electric Company, Schenectady, N.Y.

[21] Appl. No.: 589,672

[22] Filed: Jan. 22, 1996

Related U.S. Application Data

[62] Division of Ser. No. 405,618, Mar. 15, 1995, Pat. No. 5,514,604.

[51] Int. Cl.$^6$ .................................. H01L 31/0312
[52] U.S. Cl. ..................... 257/77; 257/289; 257/330; 257/331; 257/508
[58] Field of Search .................... 257/77, 289, 508, 257/136, 330, 331, 332, 333, 334, 341, 260, 263, 266

[56] References Cited

U.S. PATENT DOCUMENTS

| | | | |
|---|---|---|---|
| 4,791,462 | 12/1988 | Blanchard et al. | 357/23.4 |
| 5,451,797 | 9/1995 | Davis et al. | 257/77 |
| 5,473,176 | 12/1995 | Kakumoto | 257/192 |

OTHER PUBLICATIONS

UK Patent Application GB 2/22420 Blackstone et al. Published 11 Jan. 1984.

"Plasma Etching Methods for the Formation of Planarized Tungsten Plugs Used in Multilevel VLSI Metallizations" by RJ Saia, et al, Reprinted from Journal of the Electrochemical Society, vol. 135, No. 4, Apr. 1988, pp.936–940.

"Selective CVD Tungsten Via Plugs for Multilevel Metallization", by DM Brown et al, Reprinted from IEEE Electron Device Letters, vol. EDL-8, No. 2, Feb. 1987, pp. 55–57.

"Nitrogen–Implanted Sic Diodes Using High–Temperature Implantation", by Mario Ghezzo, et al, IEEE Electron Device Letters, vol. 13, No. 12, Dec. 1992.

*Primary Examiner*—Sara W. Crane
*Assistant Examiner*—Douglas Wille
*Attorney, Agent, or Firm*—Ann M. Agosti; Marvin Snyder

[57] ABSTRACT

A MOSFET includes a first SiC semiconductor contact layer, a SiC semiconductor channel layer supported by the first SiC contact layer, and a second SiC semiconductor contact layer supported by the channel layer. The second contact and channel layers are patterned to form a plurality of gate region grooves therethrough. Each of the gate region grooves includes a base surface and side surfaces which are covered with groove oxide material. A plurality of metal gate layers are provided, each being supported in a respective one of the plurality of grooves. A plurality of deposited oxide layers are provided, each in a respective one of the grooves so as to be supported by a respective one of the plurality of metal gate layers. A first metal contact layer is applied to the surface of the first SiC contact layer, and a second metal contact layer is applied to a portion of the surface of the second SiC contact layer.

4 Claims, 9 Drawing Sheets

VERTICAL CHANNEL SILICON CARBIDE METAL-OXIDE-SEMICONDUCTOR FIELD EFFECT TRANSISTOR WITH SELF-ALIGNED GATE FOR MICROWAVE AND POWER APPLICATIONS, AND METHOD OF MAKING

This application is a division of application Ser. No. 08/405,618, filed Mar. 15, 1995, now U.S. Pat. No. 5,514,604.

BACKGROUND OF THE INVENTION

1. Field of the Invention

This invention relates to semiconductor electronic devices, and more particularly to vertical channel silicon carbide metal-oxide-semiconductor field effect transistors having low parasitic resistance.

2. Description of the Related Art

Silicon carbide (SiC) devices have intrinsic advantages for microwave power and low frequency power conditioning applications. For example, SiC has a high field saturation velocity which is three times larger than that of gallium arsenide (GaAs). Additionally, SiC has a high intrinsic critical breakdown field which is ten times higher than that of GaAs, and SiC has a high thermal conductivity which is ten times as high as that of GaAs.

One concern when using SiC devices in microwave and low frequency power applications is that the resistance between a metal contact and a heavily doped epitaxial layer of SiC is orders of magnitude higher than the resistance between a metal contact and heavily doped silicon. Conventional electronic device structures and planar ion implanted device structures should reduce parasitic resistances by increasing the doping concentration of the n+ contact regions to very high levels. The main difficulty with all devices in which the current flows horizontally near the surface is that current crowding occurs at the edge of the contact. The spreading resistance in the current crowded region increases the impedance in that region.

SUMMARY OF THE INVENTION

Accordingly an object of the present invention is to provide a method of fabricating a SiC MOSFET which avoids the need for precision alignment of contact layers.

Another object is to provide a SiC metal-oxide-semiconductor field effect transistor (MOSFET) having minimal parasitic resistances.

In contrast to horizontal devices, vertical devices have an advantage because the current is evenly distributed across the whole area of the contact, thereby eliminating current crowding at a single edge. In the vertical device approach, the contact resistance decreases with the area of the contact whereas for the current crowing horizontal device approach the contact resistance is essentially independent of area. Vertical current flow enables easier device fabrication because precise alignment of the metal contacts to the gate (as required by horizontal devices) is not required. This is because, in horizontal devices, the thickness of the heavily doped contact region determines the spacing rather than the critical mask alignment patterning procedure of vertical devices.

Briefly, according to a preferred embodiment of the invention, a method for fabricating a SiC MOSFET comprises providing a first SiC contact layer, a SiC channel layer supported by the first SiC contact layer, and a second SiC contact layer supported by the channel layer. The second contact layer and channel layer are patterned to form a plurality of gate region grooves therethrough. Each of the gate region grooves has a base surface and side surfaces. The base surface and the side surfaces of each of the plurality of gate region grooves are covered with groove oxide material. A plurality of metal gate layers are provided so that each one of the metal gate layers is supported in a respective one of the plurality of grooves. A plurality of deposited oxide segments are provided so that each one of the deposited oxide segments is supported by a respective one of the plurality of metal gate layers. A first metal contact layer is applied on the surface of the first SiC contact layer, and a second metal contact layer is applied on a portion of the surface of the second SiC contact layer.

According to another preferred embodiment of the invention, a MOSFET comprises a first SiC semiconductor contact layer, a SiC semiconductor channel layer supported by said first SiC contact layer, and a second SiC semiconductor contact layer supported by said channel layer. The channel layer and second SiC contact layer have a plurality of gate region grooves extending therethrough and having a base surface and side surfaces. Each one of a plurality of groove oxide layers covers the base surface and the side surfaces of a respective one of said plurality of gate region grooves. Each one of a plurality of metal gate layers is supported by a respective one of said plurality of groove oxide layers. Each one of a plurality of deposited oxide segments is supported by a respective one of said plurality of metal gate layers. A first metal contact layer is situated on the surface of said first SiC contact layer, and a second metal contact layer is situated on a portion of the surface of said second SiC contact layer.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIG. 3b is a top view of the structure of FIG. 3a;

FIG. 7b is a top view of the structure of FIG. 7a;

DETAILED DESCRIPTION OF A PREFERRED EMBODIMENT OF THE INVENTION

Although the invention is applicable to both n type conductivity SiC and p type conductivity SiC, for purposes of simplicity the following description will consider fabrication only of a MOSFET of n type conductivity semiconductor.

Figure 1A:
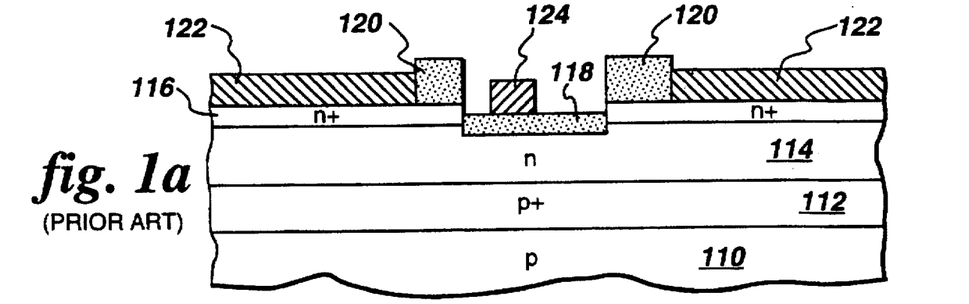
FIG. 1a is a sectional side view of one conventional SiC MOSFET.
Figure 1B:
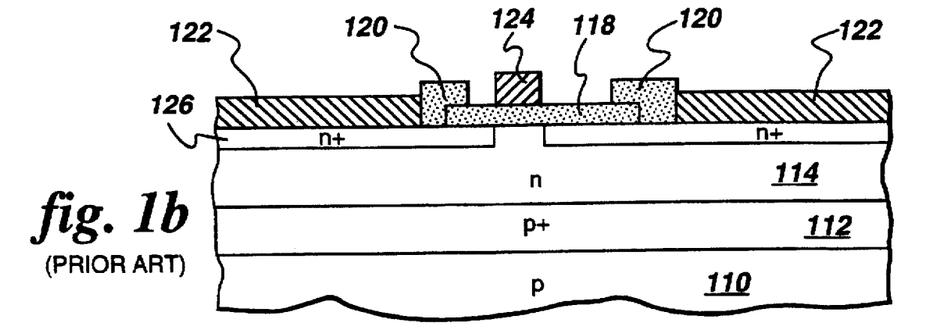
FIG. 1b is a sectional side view of another conventional SiC MOSFET.

FIG. 1a is a sectional side view of one conventional SiC MOSFET including several SiC layers, substrate layer 110, p type epitaxial layer 112, n type epitaxial channel layer 114, and n+ type epitaxial contact layer 116, with a trench through layer 116 for positioning a gate oxide layer 118, which supports a gate 124. Field oxide layers 120 are adjacent to metal contacts 122 on layer 116. FIG. 1b is a sectional side view of another conventional SiC MOSFET which is similar to that described with respect to the embodiment of FIG. 1a, except that layer 126 is ion implanted in layer 114, thus removing the need for a trench and resulting in a planar device.

In these conventional, horizontal devices, the current paths are largely restricted to the edge of the metal contact as they enter the semiconductor, and the contact impedance thus does not scale with the area of contact. This problem does not occur in the vertical device of the present invention where the current flow is spread evenly over the metal contact area, resulting in a lower contact resistance.

Figure 1C:
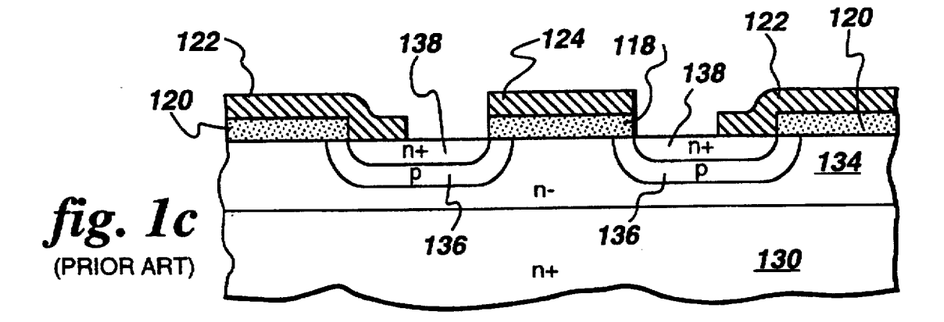
FIG. 1c is a sectional side view of another conventional SiC MOSFET.

FIG. 1c is a sectional side view of another conventional SiC MOSFET. The MOSFET in FIG. 1c is a planar, enhancement type doubly diffused MOSFET (DMOSFET). This DMOSFET has a depleted drain for supporting high voltages in the drain. The MOSFET is called a diffusion MOSFET because regions 136 and 138 are typically formed by diffusing ions in semiconductor layer 134 through the openings in the gate and field oxide areas 118 and 120, respectively. In the past, such MOSFETs typically have comprised silicon, rather than SiC, because diffusion in SiC is difficult to achieve.

Figure 2:
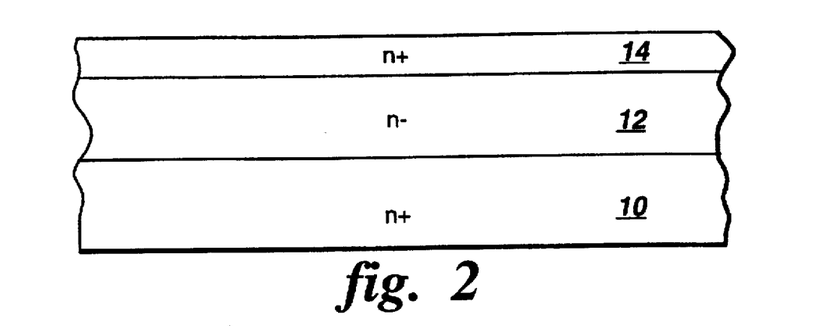
FIG. 2 is a sectional side view of first and second SiC contact layers on opposite sides of a SiC channel layer.

FIG. 2 is a sectional side view of a first SiC contact layer 10 and a second SiC contact layer 14 on opposite sides of a SiC channel layer 12. First SiC contact layer 10 is preferably a heavily doped n+ type conductivity substrate layer having a concentration ranging from $10^{18}$ to $10^{20}$ atoms/cm$^3$ and a thickness ranging from 1 to 20 μm. A p+ layer 112, as shown in FIGS. 1a–1b, is not needed for this n type embodiment because gate metal layers are ultimately to be located on both sides of the MOSFET channel.

Channel layer 12, which is supported by first SiC contact layer 10, is preferably a lightly doped n− type conductivity layer having a concentration ranging from $10^{15}$ to $10^{17}$ atoms/cm$^3$ and a thickness ranging from 0.5 to 1.0 microns. The phrase "supported by" is meant to encompass both the situation wherein an additional layer rests on layer 10 and the situation wherein a surface-adjacent portion of layer 10 has different conductivity from the bulk of layer 10. One technique of applying channel layer 12 to first SiC contact layer 10, for example, is epitaxial deposition by a method such as chemical vapor deposition (CVD). A typical dopant for channel layer 12 comprises nitrogen, for example, at a concentration of 0.5 to $1 \times 10^{17}$ atoms/cm$^3$.

Second SiC contact layer 14 is preferably a heavily doped n+ type conductivity substrate layer having a concentration ranging from $10^{18}$ to $10^{20}$ atoms/cm$^3$ and a thickness ranging from 0.2 to 1 μm. Second SiC contact layer 14 can be applied to channel layer 12 by, for example, either epitaxial deposition, as discussed above, or ion implantation of additional ionized donor atoms into channel layer 12. The dopant can comprise nitrogen atoms, for example, at a concentration of $10^{20}$ atoms/cm$^3$. The energy used for supplying the dopant by ion implantation must be varied so that the dopant is uniformly dispersed throughout the desired volume. For example, the substrate can be held at a temperature of 1000° C. during ion implantation on the furnace end station of an ion implantation apparatus, such as supplied by Implant Science Corp. of Wakefield, Mass., and subjected to a multiple implant sequence of various doses and energies to create a junction 3000 Å deep with an average concentration of $10^{20}$ atoms/cm$^3$. A multiple implant sequence having various doses and energies is needed to create a box profile because, unlike Si, it is difficult to use heating to cause ions to diffuse and "smooth out" an implanted dopant profile in SiC because of the extremely small diffusion coefficients of dopants in SiC.

Thus, ions must be implanted over a range of depths in the desired drain and source regions. Implant Science Corp. markets a computer program, known as "Profile," for SiC implantation which can model the proper doses and energies for the desired application. After implantation, the substrate is positioned in a resistively heated ceramic sintering and annealing furnace to make the implanted dopants electrically active.

Figure 3A:
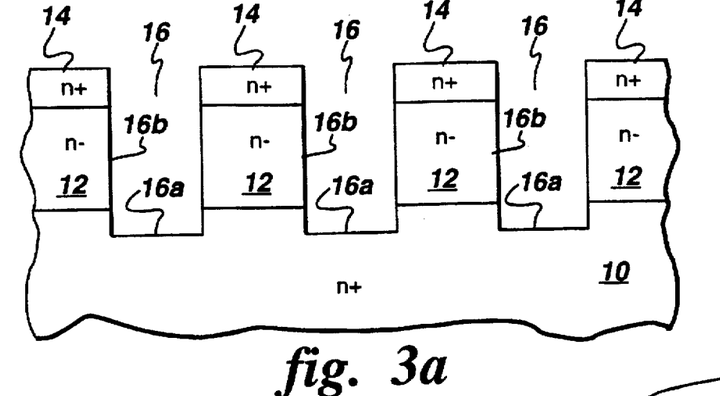
FIG. 3a is a view similar to that of FIG. 2, further showing gate region grooves in the layers.

FIG. 3a is a view similar to that of FIG. 2, further showing gate region grooves 16 extending through second SiC contact layer 14 and channel layer 12 and partially into first SiC contact layer 10. Each of the grooves has a base surface 16a and side surfaces 16b. The grooves need not extend into first SiC contact layer 10, although, it is not harmful if, as a practical matter, they do so. The grooves can be created, for example, by using a hard mask (not shown) formed by applying a layer of metal, such as aluminum, over SiC contact layer 14, and the using a photoresist to pattern desired openings in the mask surface. The metal can be deposited by sputtering and, in one embodiment is 0.5 micrometers thick. A photoresist layer can next be applied over the metal layer and then be selectively exposed and removed to pattern the metal layer. The metal can be etched by reactive ion etching (RIE) using, for example, boron-trichloride and oxygen ($BCl_3/O_2$). Although three grooves are shown, in an actual device at least ten grooves are likely to be used.

A chemical etch or a RIE process is used to remove the semiconductor material and create grooves 16 which extend at least through second SiC contact layer 14 and channel layer 12. The preferred embodiment for etching SiC includes RIE using $NF_3/O_2$ flow rate of $NF_3$ of 16 standard cubic centimeters per minute (sccm), flow rate of $O_2$ 4 sccm; pressure of 40 millitorr; power of 300 watts) which etches at a rate of 635 Å/minute. This etch is the only high resolution patterning required in the whole fabrication process. After completing the SiC etch, the metal mask is removed by a wet etch in phosphoric/nitric/acetic acid.

Figure 3B:
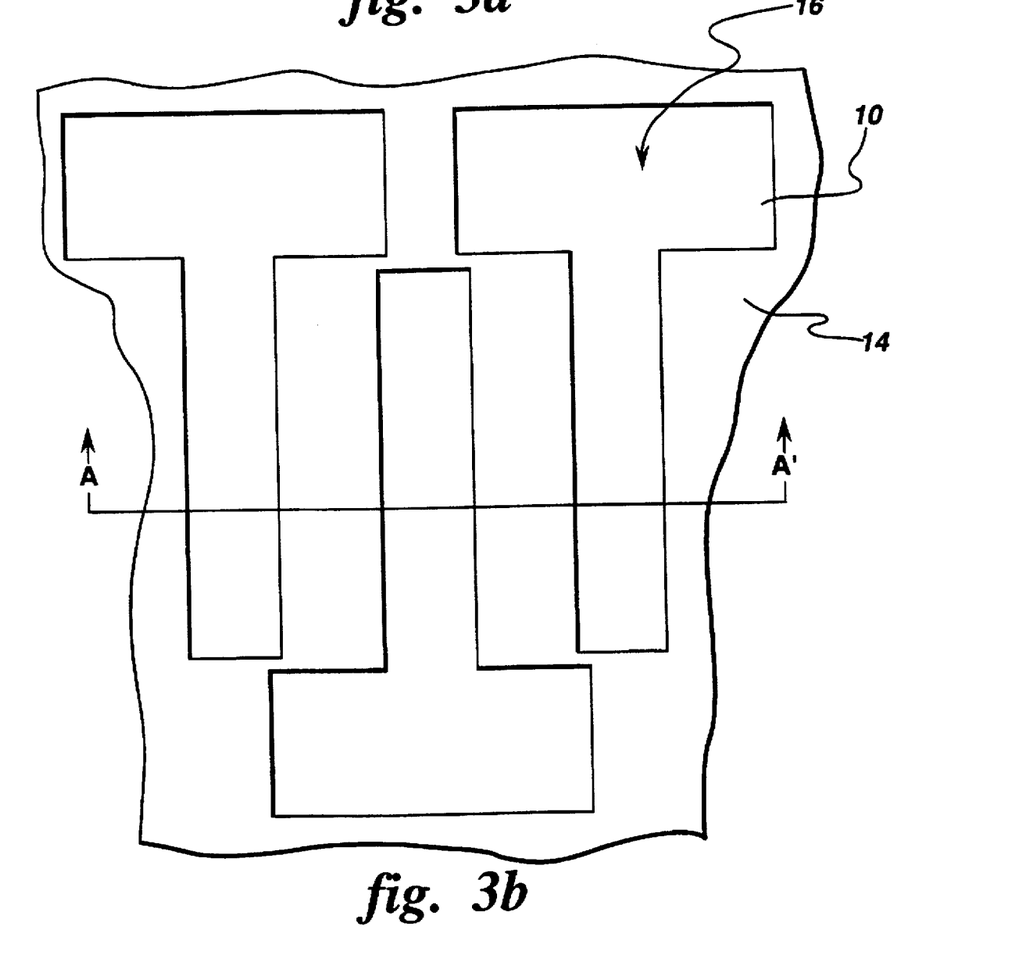

FIG. 3b is a top view of the structure of FIG. 3a, which is a sectional side view along AA' of FIG. 3b. Gate region grooves 16 preferably include narrow sections and wide sections as required to make contact to the gates, which are positioned so as to maximize the current density and minimize the space occupied by the device. Although not shown, gate region grooves 16, can be coupled, preferably at the wide sections.

Figure 4A:
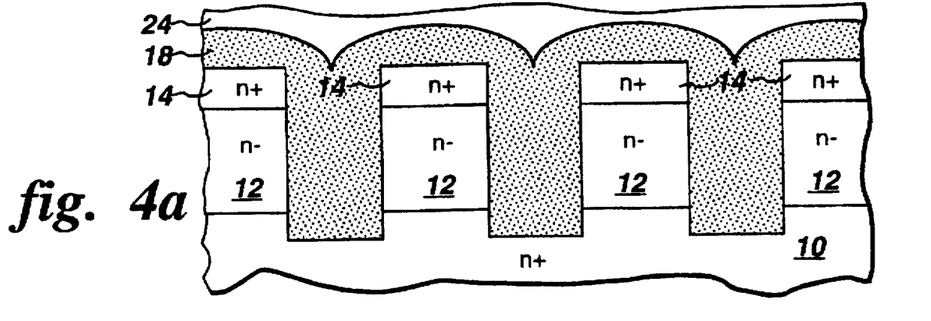
FIG. 4a is a view similar to that of FIG. 3a, further including base oxide layer material in the grooves and on the second SiC contact layer, as well as a planarization photoresist layer overlying the base oxide layer material.

FIG. 4a is a view similar to that of FIG. 3a, further including base oxide layer material 18 in the grooves and on second SiC contact layer 14, as well as a planarization photoresist layer 24 overlying the base oxide layer material. The base oxide layer can comprise $SiO_2$ deposited by CVD using silane ($SiH_4$) and oxygen, for example. In one optional embodiment, planarization photoresist layer 24 can be used to planarize the portions of base oxide layer material 18 remaining when a portion of the base oxide layer material is removed (shown in FIG. 4b) and results in a flat oxide in the bottom of the groove. If the planarization photoresist layer is not planar when first applied to the base oxide layer material, the photoresist layer can be heated until it flows and becomes planar.

Figure 4B:
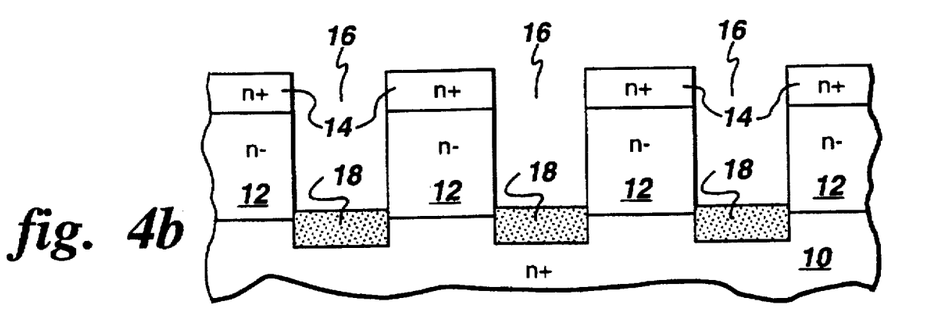
FIG. 4b is a view similar to that of FIG. 4a, showing the base oxide layer material remaining after the planarization photoresist layer and a portion of the base oxide layer material have been removed.

FIG. 4b is a view similar to that of FIG. 4a, showing base oxide layer material 18 remaining after the planarization photoresist layer 24 and a portion of the base oxide layer material 18 have been removed. An etchant which etches both base oxide layer material 18 and oxide photoresist layer 24 simultaneously at the same rate and does not afford SiC, such as, for example, mixtures of $CHF_3$ and $CO_2$, can be used. In one embodiment, the base oxide layer material is etched to a thickness of approximately 0.5 μm.

Figure 4C:
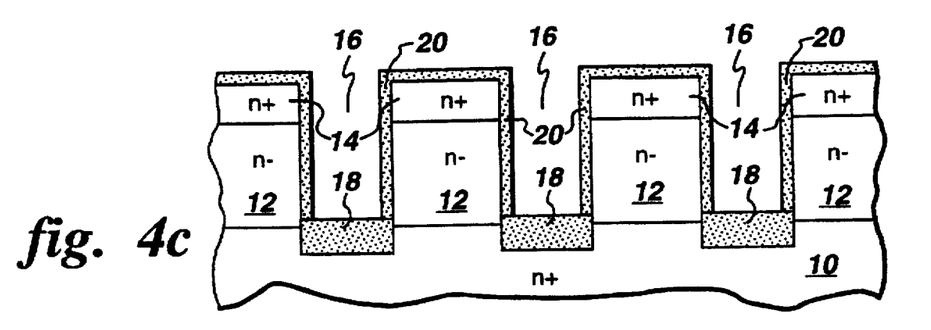
FIG. 4c is a view similar to that of FIG. 4b, further including the addition of side oxide layers.

FIG. 4c is a view similar to that of FIG. 4b, further including the addition of side oxide layers 20. Side oxide layers 20, which act as gate oxide layers for the MOSFET, can be formed by thermal oxidation using steam at a temperature of 1100° C. During the formation of side oxide layers 20, a very small portion (not shown) of additional oxide thickness is added to base oxide layers 18, and another portion of the oxide layer is formed on second SiC contact layer 14. The portion of oxide layer on SiC contact layer 14 is later removed during the thinning of the deposited oxide layer 30, as shown and discussed with respect to FIG. 6b.

Figure 4D:
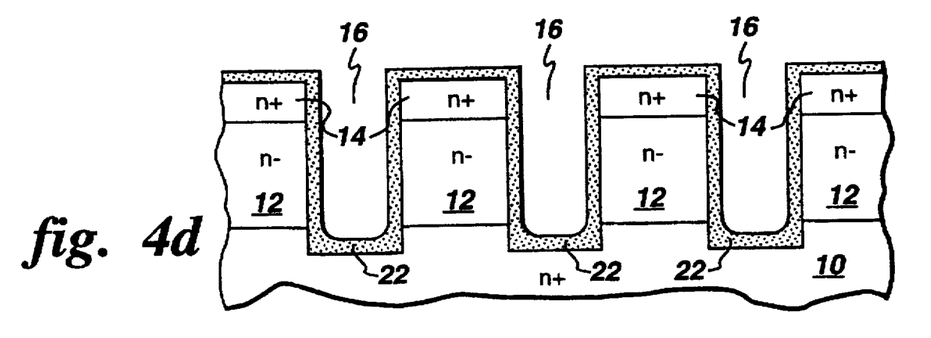
FIG. 4d is a view similar to that of FIG. 3a, showing an alternate embodiment of groove oxide material coatings from that shown in FIGS. 4a–4c.

FIG. 4d is a view similar to that of FIG. 3a, showing an alternative technique for providing groove oxide material. In this embodiment, rather than preparing a base layer 18, as shown with respect to the embodiment of FIGS. 4a–4c, a groove oxide layer 22 is grown directly on all surfaces of grooves 16 by a process similar to that discussed with respect to the embodiment of FIG. 4c, resulting in an oxide thickness of approximately 1.0 μm. Although the remaining figures illustrate further stages of the embodiment shown in FIGS. 4a–4c, the embodiment of FIG. 4d is equally applicable. The term "groove oxide material" is intended to encompass both the base layers 18 and side layers 20 of FIGS. 4a–4c and the groove oxide layers 22 of FIG. 4d.

Figure 5A:
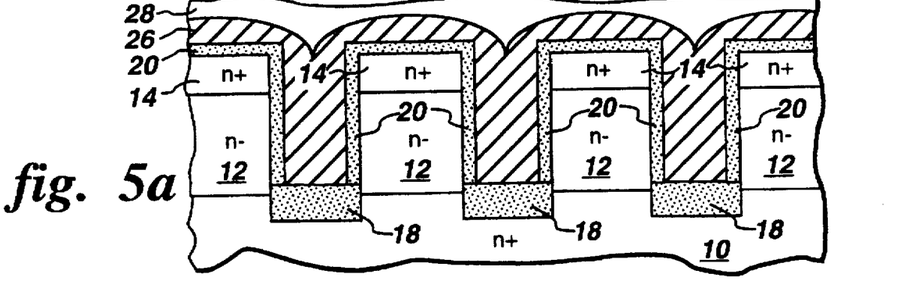
FIG. 5a is a view similar to that of FIG. 4c, further showing metal gate layer material in the grooves and on the side oxide layers, as well as a planarization photoresist layer overlying the metal gate layer material.

FIG. 5a is a view similar to that of FIG. 4c, further showing metal gate layer material 26 in grooves 16 and on side oxide layers 20, as well as a planarization photoresist layer 28 overlying the metal gate layer material. In one embodiment, metal gate layer material 26 comprises molybdenum, tungsten, or doped polysilicon.

Figure 5B:
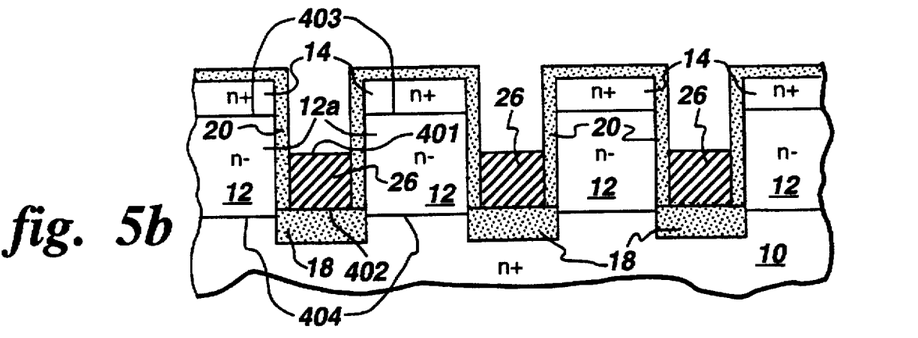
FIG. 5b is a view similar to that of FIG. 5a, showing the metal gate layer material remaining after the planarization photoresist layer and a portion of the metal gate layer material have been removed.

FIG. 5b is a view similar to that of FIG. 5a, showing the metal gate layer material remaining after the planarization photoresist layer and a portion of the metal gate layer material have been removed. Reactive ion etching using $CCl_2F_2+O_2$ can be used to etch photoresist and refractory metals at the same rate, as disclosed in R. J. Saia et al., "Plasma Etching Methods for the Formation of Planarization Tungsten Plugs Used in Multilevel VLSI Metallizations," Journal of the Electrochemical Society, Vol. 135, No. 4, 936–940 (April 1988). Because the gate is in the groove, the thickness of the remaining gate metal layer 26 is the gate length. Typical gate metal thicknesses can range from 0.1 to 2 μm. In one embodiment, as shown in FIG. 5b, base groove oxide layer 18 and the metal gate layers 26 are fabricated with a first surface 402 of each metal gate layer 26 situated above a contact surface 404 of first contact layer 10 and a second surface 401 of each metal gate layer situated below a contact surface 403 of second contact layer 14. In this manner, during device fabrication, each of the first surfaces 402 is situated on a plane above the first contact layer while each of the second surfaces 401 is situated on a plane below the second contact layer. After the device is fabricated, the physical orientation of the device (whether the MOSFET is in an orientation where first contact layer 10 is the bottom of the device as opposed to a side or top of the device) is not significant. However the MOSFET is oriented, each of the metal gate layers 26 remains between portions 12a of the channel layer 12 and therefore does not extend beyond channel layer 12 into the first or second contact layers.

Figure 6A:
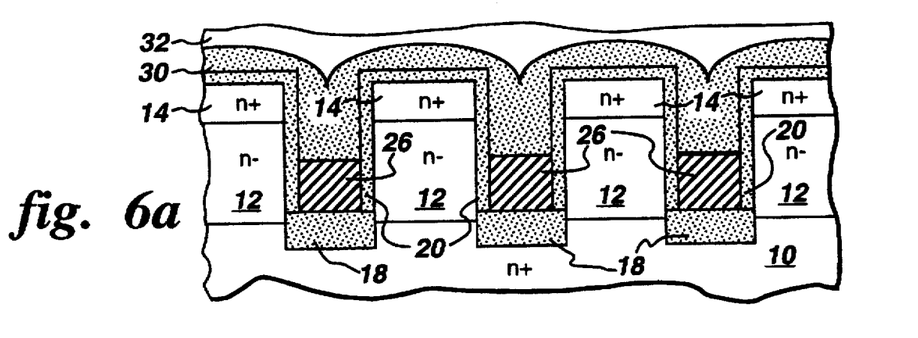
FIG. 6a is a view similar to that of FIG. 5b, further showing deposited oxide layer material in the grooves and on the side oxide layers, as well as a planarization photoresist layer overlying the deposited oxide layer material.

FIG. 6a is a view similar to that of FIG. 5b, further showing deposited oxide layer material 30 in grooves 16 and on side oxide layers 20, as well as a planarization photoresist layer 32 overlying the deposited oxide layer material.

Figure 6B:
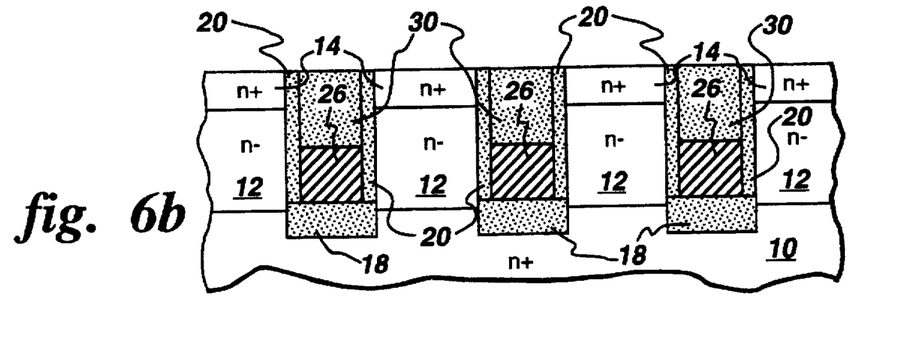
FIG. 6b is a view similar to that of FIG. 6a, showing the deposited oxide layer material remaining after the planarization photoresist layer, a portion of the deposited oxide layer material, and portions of the side oxide layers have been removed.

FIG. 6b is a view similar to that of FIG. 6a, showing the deposited oxide layer material segments remaining after the planarization photoresist layer and a portion of the deposited oxide layer material have been removed. This process is similar to that discussed with respect to the embodiments of FIGS. 4a–4c. The deposited oxide layer material (including the portion of side oxide layer 20 situated on top of second SiC contact layer 14) is etched until it is substantially planar with second SiC contact layer 14.

Figure 7A:
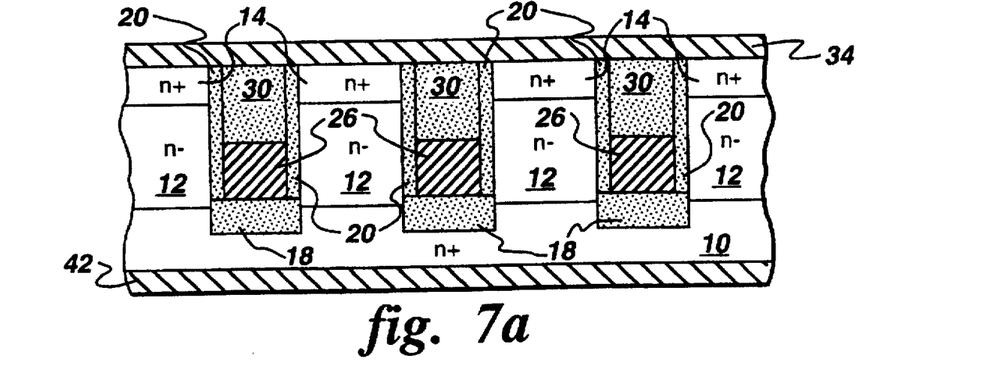
FIG. 7a is a view similar to that of FIG. 6b, further showing metal contact layers over the first and second SiC contact layers.

FIG. 7a is a view similar to that of FIG. 6b, further showing a first metal contact layer 42 adjoining first SiC contact layer 10 and a second metal contact layer 34 over second SiC contact layer 14 and the deposited oxide segments 30. In one embodiment, metal contact layers 42 and 34 comprise nickel having a thickness of approximately 1 μm. Alternatively, the metal contact layers can comprise a thin nickel layer which is sintered to make a good contact and then covered with thicker metal layers like titanium covered by gold or titanium covered by molybdenum covered by gold. The metal contact layers can be patterned after application, if desired. Preferably the metal contact layers are then sintered at a temperature of approximately 95° C. for 2 minutes.

Typically, first metal contact layer 42 will be used as a MOSFET source and second metal contact layer 34 will be used as a drain; however, these functions can be reversed if desired. Another fabrication option is the order of the steps involving the application of the metal contact layers. Second metal contact layer 34 can be applied, patterned, and sintered before, after, or simultaneously with, metal contact layer 42.

Figure 7B:
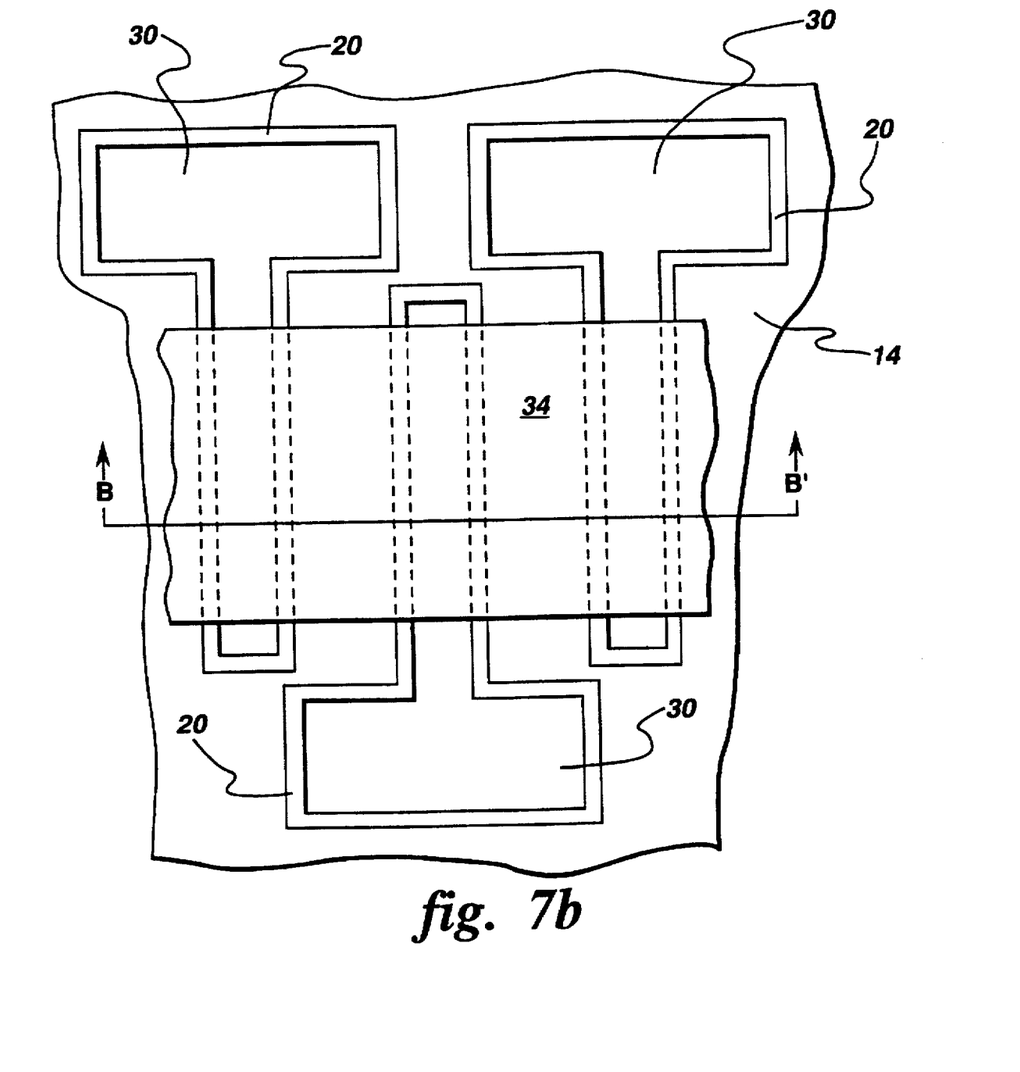

FIG. 7b is a top view of the structure of FIG. 7a, which is a sectional side view along line BB' of FIG. 7b. In this embodiment second metal contact layer 34 is one sheet covering a large portion of the device. An advantage to this configuration is that no precise patterning is involved.

Figure 7C:
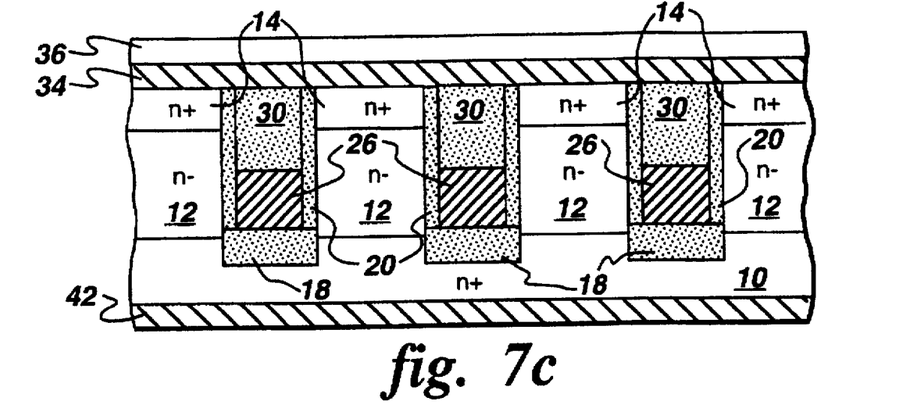
FIG. 7c is a view similar to that of FIG. 7a, further including a metal photoresist layer over the second metal contact layer.

FIG. 7c is a view similar to that of FIG. 7a, further including a photoresist layer 36 over second metal contact layer 34.

Figure 7D:
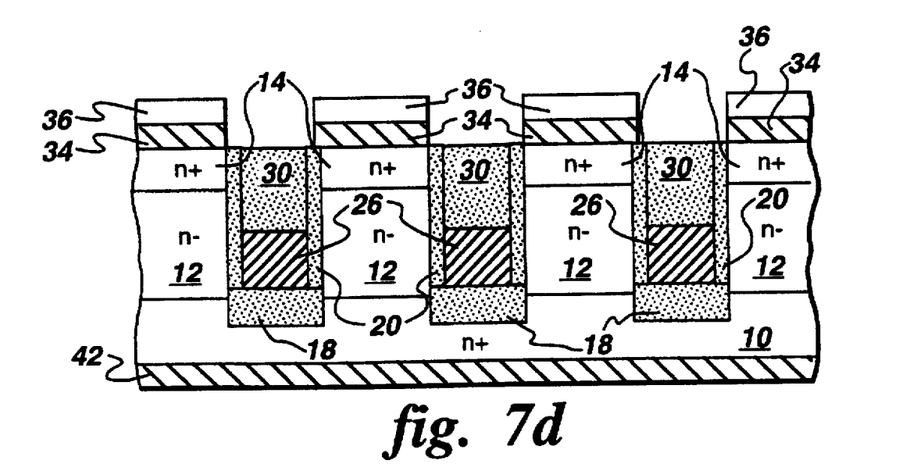
FIG. 7d is a view similar to that of FIG. 7c, showing portions of the second metal contact layer and metal photoresist layer removed.
Figure 7E:
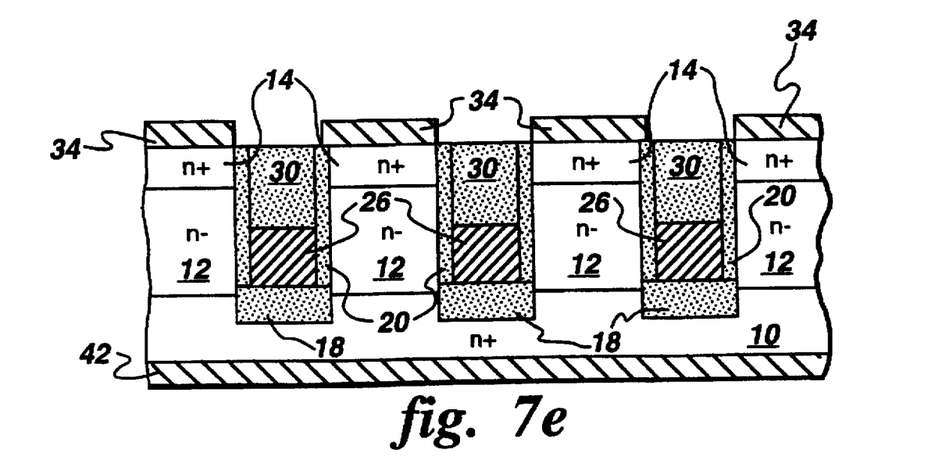
FIG. 7e is a view similar to that of FIG. 7d, showing the second metal contact layer remaining after the removal of the photoresist layer.

In an alternative embodiment to the single sheet design of the embodiment of FIG. 7b, FIG. 7d is a view showing portions of second metal contact layer 34 and portions of photoresist layer 36 removed, and FIG. 7e is a view showing second metal contact layer 34 remaining after the removal of the remainder of photoresist layer 36. These portions need not be precisely aligned because of the presence of the insulating oxide 30 between these portions. When portions of second metal contact layer 34 are removed, the capacitance between second metal contact layer 34 and gate metal layer 26 is reduced.

Figure 8A:
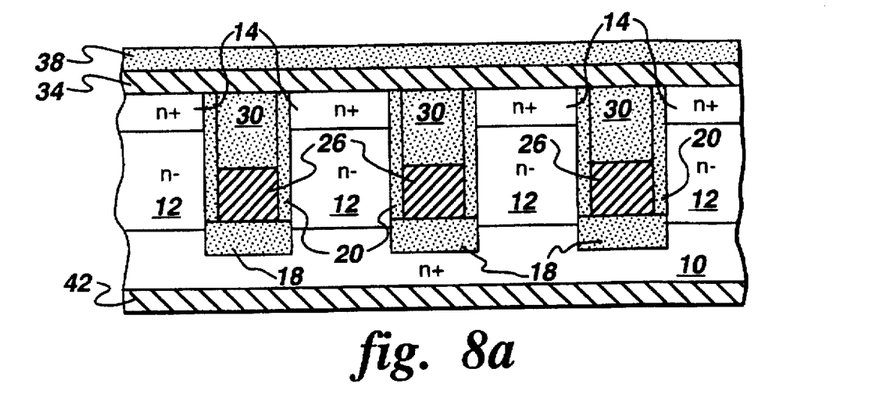
FIG. 8a is a view similar to that of FIG. 7a, further showing the addition of a surface oxide layer over the second metal contact layer.

FIG. 8a is a view similar to that of FIG. 7a, further showing the addition of a surface oxide layer 38 over second metal contact layer 34. The surface oxide layer preferably has a thickness ranging from 0.5 to 2 μm and comprises SiO$_2$.

Figure 8B:
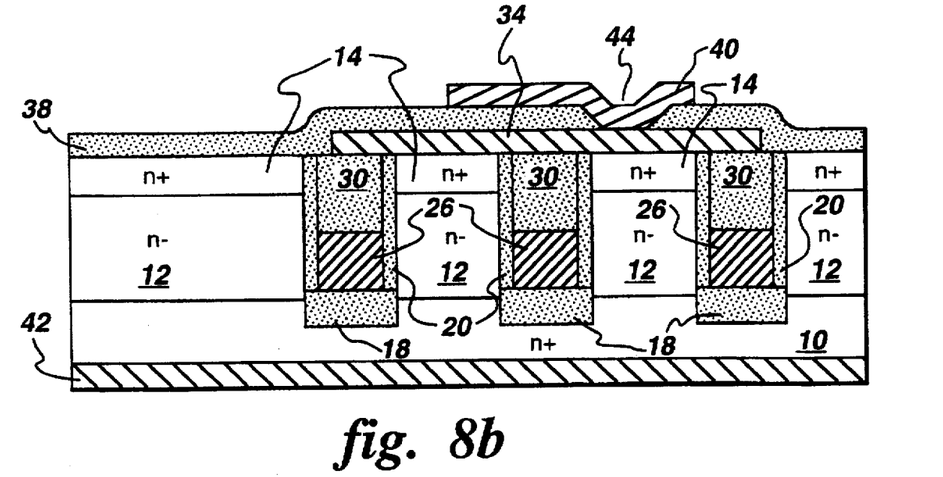
FIG. 8b is a view similar to that of FIG. 8a, further showing openings in the surface oxide layer and a contact pad extending through the opening to the second metal contact layer.

FIG. 8b is a view similar to that of FIG. 8a, further showing a surface oxide opening 44 in surface oxide layer 38 and contact pad 40 extending through the opening to metal contact layer 34. To avoid parallel conductive paths in the field surrounding the active device regions defined by the grooves, the metal contact layer 34 is terminated inside the outside edge of the two most exterior grooves. Opening 4 can be formed by using a mask and RIE. Preferably the contact pad comprises multiple layers of metals, for example, titanium, which is covered by platinum, which in turn is covered by gold. The contact pad can be formed using a photoresist pattern. In one embodiment, a lift-off process is used whereby patterned photoresist can be used as an integral stencil mask in which after the photoresist pattern is formed the metals are deposited and then lifted off in those regions where the photoresist still remains.

Figure 8C:
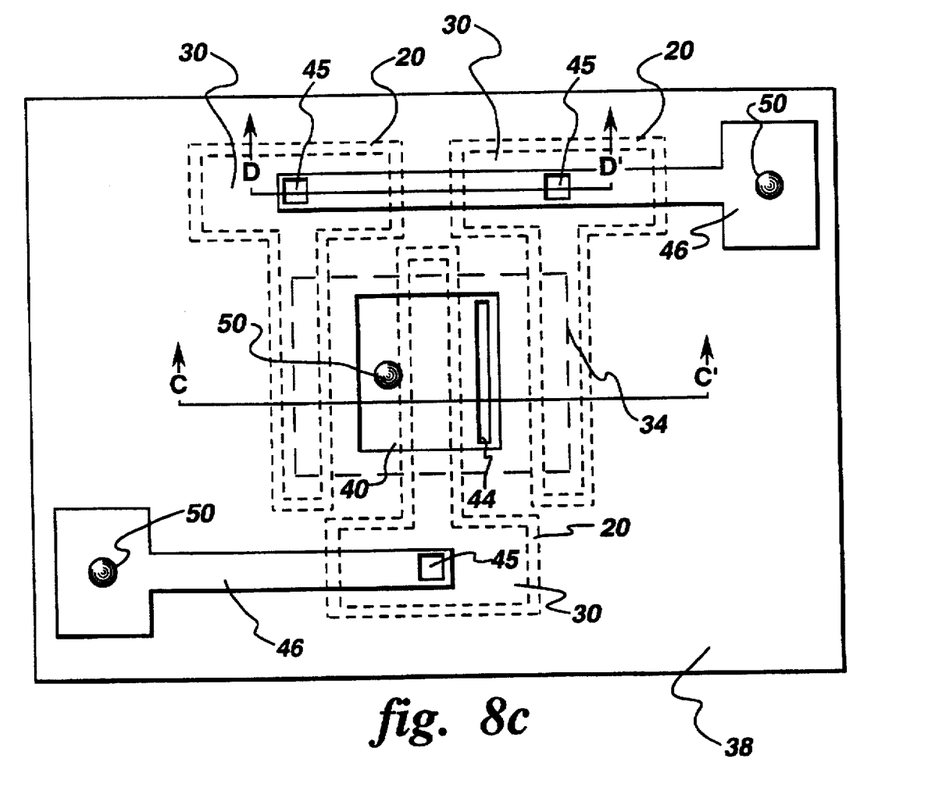
FIG. 8c is a top view of the structure of FIG. 8b, further showing openings in a surface oxide layer and contact pads extending to gate metal layers, as well as wire ball bonds on the contact pads.
Figure 8D:
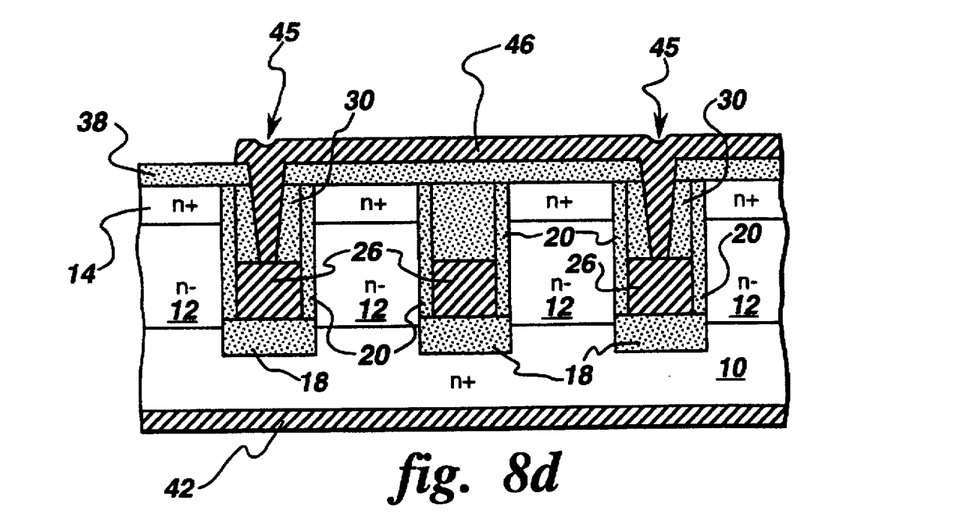
FIG. 8d is a sectional side view along line DD' of FIG. 8c.

FIG. 8c is a top view of the MOSFET structure of FIG. 8b, which is a sectional side view along line CC' of FIG. 8c, further showing openings 45 in surface oxide layer 38 extending through deposited oxide segments 30 to gate metal layers 26 (gate metal layers 26 shown in FIG. 8b) and contact pads 46 connecting selected gate metal layers in parallel. Also shown are wire ball bonds 50 which are used for connecting the completed MOSFET to package pins (not shown). FIG. 8d is a sectional side view along line DD' of FIG. 8c showing contact pad 46 extending to gate metal layers 26.

With this design, enhanced gate control occurs because the channel region is pinched from both sides, a feature which will be especially desirable for more heavily doped channel regions because depletion distances decrease with increases in ionized impurity concentration. Large increases in doping also overcome the disadvantage of low carrier mobilities in SiC, thereby decreasing the parasitic resistances in those regions of the device on both sides of the channel region. High field operation is desirable because the high field saturation velocity of electrons in SiC is extremely high and the performance is thereby enhanced if voltages that induce high electric fields in the channel region can be utilized. This is possible because of the high intrinsic breakdown field, and therefore results in shorter channels and higher performance.

Surface oxide layer 38 and contact pads 40 are not required if the openings 45 extending through deposited oxide layers 30 to gate metal layers 26 are formed before the application of second metal contact layer 34. The second metal contact layer can be patterned to form at least one contact pad extending to selected gate metal layers and at least one other separate contact pad on the surface of second contact layer 14 to function as a source or drain contact, and wire ball bonds can be directly attached.

Figure 9A:
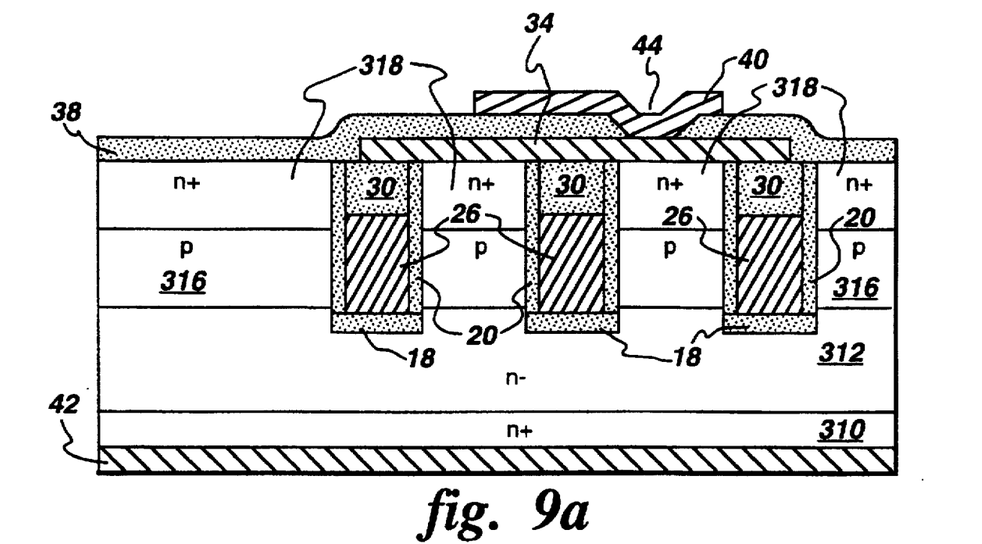
FIG. 9a is a view similar to that of FIG. 8b with different semiconductor channel and contact layers.

FIG. 9a is a view similar to that of FIG. 8b with semiconductor contact layers of different conductivity types than those in FIGS. 2–8d. The MOSFET of FIG. 9a operates as an enhancement type high voltage device like that of FIG. 1c, but has the advantage that no diffusion is required.

A heavily doped n+ type conductivity contact substrate layer 310 can have a concentration ranging from $10^{18}$–$10^{20}$ atoms/cm$^3$. Next a lightly doped n– type conductivity layer 312, preferably having a concentration ranging from $10^{14}$–$10^{16}$ atoms/cm$^3$ and a thickness ranging from 1–10 μm, is applied to substrate 310. A p type conductivity layer channel 316, with a conductivity ranging from $10^{15}$–$10^{17}$ atoms/cm$^3$ and a thickness ranging from about 0.5 microns to 1 micron, is applied over n– type layer 312. An n+ type conductivity layer 318, having, for example, a conductivity ranging from $10^{18}$–$10^{20}$ atoms/cm$^3$ and a thickness ranging from 0.2–1 μm, is applied over p type layer 316.

Gate region grooves 16 (shown in FIG. 3a) extend through p type layer 316. The MOSFET is designed so that, when when metal gate material 26 is added to groove oxide material 20 and 18, the height of gate material 26 extends slightly vertically above and below the level of p type conductivity layer 316. Other than the types of SiC layers used and the position of the gate material with respect to p type layer 316, the MOSFET of FIG. 9a can be fabricated in the same manner as the MOSFET of FIG. 8b.

Figure 9B:
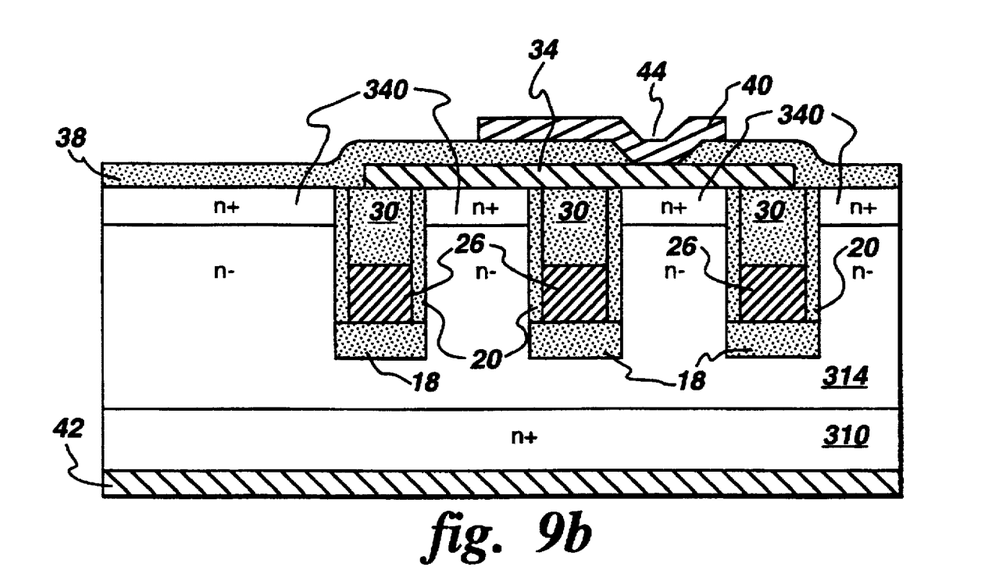
FIG. 9b is another view similar to that of FIG. 8b wherein the gate region grooves do not extending completely through the channel layer.

FIG. 9b is another view similar to that of FIG. 8b, wherein gate region grooves 16 (shown in FIG. 3a) do not extend completely through a SiC channel layer 314. In the embodiment of FIG. 9b, a substrate 310 can be similar to first SiC contact layer 10 which is discussed with respect to FIG. 2. Channel layer 314 of FIG. 9b is preferably thicker than channel layer 12 of FIG. 2, with a thickness ranging from 2–20 microns and a conductivity ranging from $10^{15}$ to $10^{17}$ atoms/cm$^3$. A contact layer 340 of FIG. 9b is similar to second contact layer 14 of FIG. 2. The embodiment of FIG. 9b provides a high voltage depletion mode MOSFET.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A metal-oxide-semiconductor field effect transistor (MOSFET) comprising:

a first SiC semiconductor contact layer;

a SiC semiconductor channel layer supported by said first SiC semiconductor contact layer;

a second SiC semiconductor contact layer supported by said SiC semiconductor channel layer, said SiC semiconductor channel and second SiC semiconductor contact layers having a plurality of gate region grooves extending completely therethrough and having a base surface and side surfaces;

a plurality of metal gate layers, each one of said plurality of groove oxide layers covering the base surface and the side surfaces of a respective one of said plurality of gate region grooves;

a plurality of metal gate layers, each one of said plurality of metal gate layers being supported by a respective one of said plurality of groove oxide layers and having first and second surfaces, the first surface being situated on a plane above said first SiC semiconductor contact layer and the second surface being situated on a plane below said second SiC semiconductor contact layer;

a plurality of deposited oxide segments, each one of said plurality of deposited oxide segments being supported by a respective one of said plurality of metal gate layers and being substantially coplanar with said second SiC semiconductor contact layer;

a first metal contact layer situated on the surface of said first SiC semiconductor contact layer; and a second metal contact layer situated on a portion of the surface of said second SiC semiconductor contact layer.

2. The MOSFET of claim 1, further comprising:

a surface oxide layer supported by said second metal contact layer, said surface oxide layer having first openings extending to said second metal contact layer and second openings extending through at least one of said plurality of deposited oxide segments to at least one of said plurality of metal gate layers;

a first contact pad situated on said surface oxide layer extending through at least one of said first openings to contact said second metal contact layer; and a second contact pad extending through at least one of said second openings to contact at least one of said plurality of metal gate layers.

3. The MOSFET of claim 1, wherein at least one of said plurality of deposited oxide segments includes a conductive opening through which said second metal contact layer extends to contact a respective one of said plurality of metal gate layers, a portion of said second metal contact layer being in contact with said at least one conductive opening and being separate from another portion of said second metal contact layer.

4. The MOSFET of claim 1, wherein said first SiC semiconductor layer, said SiC semiconductor channel layer, and said second SiC semiconductor contact layer are all of the same conductivity type.

* * * * *